United States Patent [19]

Lomashevitch et al.

[11] Patent Number: 5,349,593
[45] Date of Patent: Sep. 20, 1994

[54] OPTICAL REGENERATOR USING BISTABLE FABRY-PEROT INTERFEROMETER

[75] Inventors: Svjatoslav A. Lomashevitch; Yuri V. Svetikov, both of Sankt-Peterburg

[73] Assignee: Samsung Electronics Co., Ltd., Kyungki, Rep. of Korea

[21] Appl. No.: 85,935

[22] Filed: Jul. 6, 1993

[30] Foreign Application Priority Data

Jul. 6, 1992 [RU] Russian Federation ............ 5051990

[51] Int. Cl.$^5$ .................. H01S 3/10; H01S 3/106; G02F 3/00
[52] U.S. Cl. ........................... 372/50; 372/8; 359/243; 359/176
[58] Field of Search ............... 372/50, 8, 97, 69–71; 359/108, 176, 241–243

[56] References Cited

U.S. PATENT DOCUMENTS

| | | | |
|---|---|---|---|
| 4,518,934 | 5/1985 | Venkatesan | 372/21 |
| 4,701,030 | 10/1987 | Jewell | 350/354 |
| 5,001,523 | 4/1991 | Lomashevich et al. | 372/8 |
| 5,073,981 | 12/1991 | Gies et al. | 372/8 |

FOREIGN PATENT DOCUMENTS 0055638 4/1980 Japan ................................ 359/176

OTHER PUBLICATIONS

"How to enlighten computer logic", Science news, vol. 124 Oct. 29, 1983 pp. 278–279.

*Primary Examiner*—Rodney B. Bovernick
*Assistant Examiner*—Robert McNutt
*Attorney, Agent, or Firm*—Robert A. Westerlund; Stephen R. Whitt; Charles R. Donohoe

[57] ABSTRACT

Disclosed herein is an all-optical regenerator which is controlled by an external input optical signal for the generation of an output optical signal satisfying certain preset parameters defining the shape and the amplitude of the output optical signal. The optical device comprises a rectangular phase modulator optically coupled between two resonators so that the inlet mirrors of the resonators and the phase modulator form a nonlinear Fabry-Perot interferometer. The phase modulator serves to generate an output signal of a predetermined or desired pulse width and amplitude. The present optical device also includes a multielectrode injection laser which is optically coupled to the phase modulator. The multielectrode injection laser selects the clock frequency and locks output pulses in conformity with the period of the clock frequency.

5 Claims, 7 Drawing Sheets

OPTICAL REGENERATOR USING BISTABLE FABRY-PEROT INTERFEROMETER

FIELD OF THE INVENTION

This invention pertains to the processing of digital information in the form of optical signals applicable in the areas of, e.g., optical-fiber communication and information transmission systems, and integral optics and computer engineering circuits; and, more particularly, to an all-optical semiconductor device capable of performing such various functions as regeneration, amplification, and switching of optical signals, which has a semiconductor structure.

DESCRIPTION OF THE PRIOR ART

There has been a growing demand for devices made of all-optical components for performing such functions as clock recovery, pulse reshaping and signal amplification without having to go through intermediate electronic stages. One possible approach to constructing, e.g., an all-optical regenerator may be based on a system wherein optical signals exist at all stages of signal processing with sufficiently high speed performance and simple configuration, preferably, by employing semiconductor components. Steady developments have been made towards this direction during the last decade.

One of such devices is disclosed in an article authored by W. T. Tsang et al., "Mode-locked Semiconductor Lasers with Gateable Output and Electrically Controllable Optical Absorber", *Appl. Phys. Lett.*, 43, No. 4, pp 339–341 (1983), which consists of three coupled laser diodes for the generation of mode-locked semiconductor laser. In this device, a first laser diode serves as a source of radiation; and, together with an electrically controllable optical absorber, forms a laser with a saturable absorber, which generates mode-locked optical pulses. A third diode serves as an electronic shutter for providing an electrically gateable mode-locked semiconductor laser capable of coding information on picosecond(ps) output optical pulses. Unfortunately, however, the problem of the output control has surfaced as a drawback for this type of devices to achieve the all-optical processing. Further, the device is essentially a laboratory mock-up utilizing outside grating for the active mode-locking, whose practicability is, therefore, highly questionable.

Another device capable of selecting the clock frequency by using a multielectrode semiconductor laser has been proposed by M. Jinno et al. in their article, "All-Optical Timing Extraction Using a 1.5 μm Self-Pulsating Multielectrode DFB LD", El. Lett., 24, No. 23, pp 1426–1427 (1988). Enclosed therein is a device which operates in an optical injection-locking condition. This device is capable of synchronizing output optical pulses with the clock frequency under the effect of input pulses. However, the device is not a regenerator of optical pulses (signals) as it cannot amplify the signals nor can it regenerate their shape.

Other types of devices contemplated for use include a ring resonator (vibrator) or a Fabry-Perot interferometer for adjusting a definite frequency, as disclosed in "All-Optical Timing Extraction Using Optical Tank Circuits", *Proceedings of* 100'89, *Technical Digest*, 4, pp 96–97 (1989), by M. Jinno and T. Natsumoto, which generates optical pulses with a period coinciding with the roundtrip transit time of the ring resonator. Again, this device is not a regenerator of optical signals as it is not capable of reshaping the information signals in terms of their shape and amplitude.

One of the well known and more recent systems is the one based on two self-electro-optic effect devices (SEED). This device is capable of carrying out various functions of optical signals processing, with a 2 dB optical gain, including signal detection, clock recovery, data timing and signal clocking, wherein said SEED is biased through a parallel LC circuit. See C. R. Giles et al., "All-Optical Regenerator", *El. Lett*, 24, No. 14, pp 848–850 (1988). From the practical point of view, however, this device comprising such electrical components is not preferably for all-optical regenerators; and, furthermore, no marked improvement in the recoverable data bit rate is expected from this device due to the inherent low response speed of SEED: as an illustration of the point, about 5 kbit/s has been reportedly achieved therefrom. Besides, the device cannot generate output signals in their desired shape and/or pulse width.

The closest prior art device to the present invention, from the technical point of view, may be the one called, "Cleaved-Coupled Cavity ($C^3$) Laser" disclosed in U.S. Pat. No. 4,622,671 issued to W. T. Tsang on Nov. 11, 1986, which is intended to operate in a longitudinal mode at high speeds of direct modulation. The ability to control the output optical radiation frequency within the frequency excursion of 150 Å and the frequency tuning rate of 10 Å/mA, by adjusting the currents in the cells of the $C^3$ laser is another important advantage of the $C^3$ laser. However, this device suffers from a number of deficiencies: that is, the output modulation alone is electrically controlled; generation of optical pulses in an autovibration mode is not possible; the device cannot be controlled with an external optical signal; and, as a consequence, generation of output optical signals with definite parameters under the effect of a input optical signal is not possible.

SUMMARY OF THE INVENTION

It is, therefore, a primary object of the present invention to provide an optical device which is controlled by an external input optical signal for the generation of an output optical signal satisfying certain preset parameters defining the shape and the amplitude of the output optical signal.

In accordance with the present invention, there is provided with an optical device which comprises a rectangular phase modulator optically coupled between the inlet mirrors of a first and a second active resonators so that the inlet mirrors of the resonators and the phase modulator form a nonlinear Fabry-Perot interferometer. In this case, the inlet mirrors of the first and the second active resonators have a greater transmissivity than the outlet mirrors thereof.

The present optical device also includes a multielectrode injection laser which is optically coupled to one of the free interface of the phase modulator and is provided with a saturable absorber.

Further, the upper and lower faces of the phase modulator are provided with ohmic contacts. The phase modulator and the saturable absorber may be fabricated on a single component.

The instant optical device may be further defined to comprise: the first and the second active resonators, the phase modulator and the multi-electrode injection laser being fabricated on a mono-crystal; the inlet and outlet mirrors of the first and the second active resonators being made in the shape of Bragg mirrors. The optical device may be still further defined to comprise the optical coupling between all the elements being achieved by a means of distributed feedback structure.

It is important to note that, in accordance with the present invention, output optical signals which fully satisfy the predetermined parameters of amplitude and shape are generated upon a simultaneous switching of all the elements constituting the device.

The phase modulator, together with the mirrors of the resonators, forming a non-linear Fabry-Perot interferometer, and optically coupled to the multielectrode injection laser, enables the present device to display unique and remarkable properties which differentiate it from any of the prior art devices discussed above, some of which are summarized below:

1. Possibility of controlling the whole device through the use of external input optical signals.

This is attained by means of the phase modulator.

2. Generation of an output signal of a predetermined or desired pulse width and amplitude.

This is achieved in accordance with the present invention by the operation of the injection laser and the output signal generation section described later.

3. Selection of the clock frequency and locking of output pulses in conformity with the period of the clock frequency.

This is obtained through the operation of the multielectrode laser including a saturable absorber and the means for controlling the phase modulator.

4. Possibility of dividing the output signals into two channels.

5. Possibility of re-emission of optical signals within the range of 8 to 10 optical frequencies.

This result is attainable due to the ability to control the optical length of the output signal generation section by the action of the phase modulator.

6. Generation and emission (radiation) of the clock frequency optical signals within the range of 8 to 10 frequencies.

This is possible due to the constant input optical signal generated.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE PREFERRED EMBODIMENTS

Figure 1:
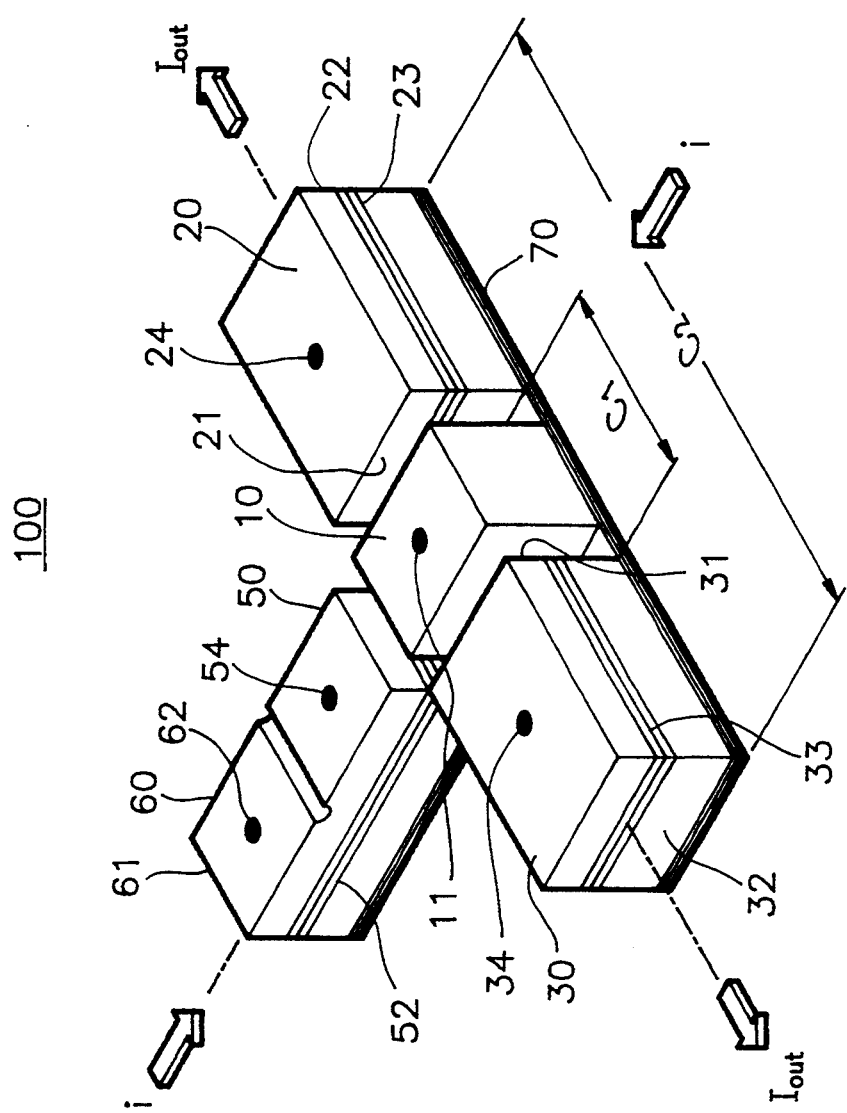
FIG. 1 is a perspective view illustrating the structure of an optical device employing a phase modulator located between the inlet mirrors of the resonators of $C^3$-laser, in accordance with a preferred embodiment of the present invention.

Referring first to FIG. 1, a novel all-optical regenerator 100 is provided with a phase modulator 10 located between an inlet mirror 21 of a first resonator 20 and an inlet mirror 31 of a second resonator 30. The first resonator 20 and the second resonator 30 are identical to those used in the cleaved-coupled-cavity ($C^3$) laser disclosed in U.S. Pat. No. 4,622,671 discussed above.

The phase modulator 10 together with mirrors 21 and 31 forms a non-linear Fabry-Perot interferometer C1.

An outlet mirror 22 of the first resonator 20 and an outlet mirror 32 of the second resonator 30 form an output signal generation section C2.

A double injection laser consists of two cells: an active cell 50 and a saturable absorber cell 60 having an inlet mirror 61.

Ohmic contacts 11 and 62 serve to supply voltage to the phase modulator 10 and the saturable absorber cell 60; and ohmic contacts 24, 34 and 54 serve to supply current to the first and the second resonators 20 and 30 and the active cell 50. The lower contact 70 serves as a heat sink. Active areas of the first and the second resonators 20 and 30, and of the double injection laser are designated by reference numerals 23, 33 and 52, respectively.

The semiconductor lasers 20, 30, 50 and 60 are manufactured by employing any of the known techniques, on the basis of three-component solid solutions in the system of, e.g., GaAs-AlAs, or four-component solutions in the system of, e.g., InGaAsP. The lower electrodes 70 are secured, by using an indium based solder, to an electrically conductive backing, observing the alignment of the inlet mirrors 21 and 22 of the first and second resonators 20 and 30 along a longitudinal optical axis (dashed line). Perpendicularly to this optical axis, the double injection laser 50 and 60 is installed and secured by the same method for the lasers 20 and 30.

The phase modulator 10 which is made of a non-linear electrooptical material, together with the electrodes 11 on the upper portion, is attached between the lasers 20 and 30 on the same optical axis by using an indium based solder to the lower contact 70. The lead-outs are soldered to the upper electrodes 11, 24, 34, 52 and 62, and the lower electrode 70.

It is possible to manufacture the phase modulator 10 of any nonlinear optical material which differs from the material the lasers 20, 30 and 50 are made of.

The active areas of radiation 23, 33 and 52 of the lasers 20, 30 and 50 shown in FIG. 1 may be made in a multiple quantum wells (MQW) structure.

Figure 2:
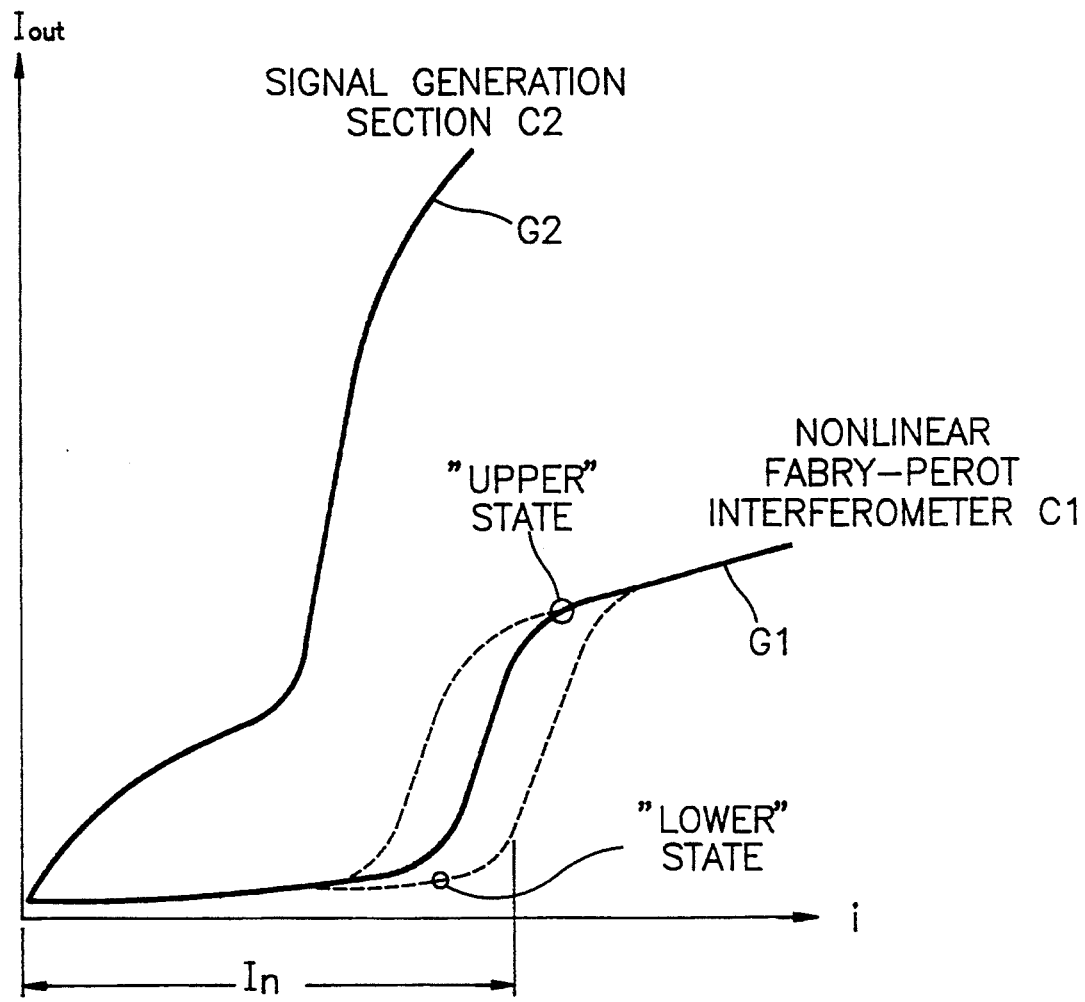
FIG. 2 is a graph explaining the relationship between the intensities of an output optical signal and an input optical signal generation section.

Referring now to FIG. 2, curve G2 shows the intensity of the output optical signal $I_{out}$ depending upon the input optical signal i in the signal generation section C2; and curve G1 depicts the bistable characteristics of the nonlinear Fabry-Perot interferometer C1.

When there exists no external input signal i, the current applied through the ohmic contacts 24 and 34 to the output signal generation section C2 is selected below its threshold value so that the intensity of laser will be insufficient for the "brightening" of the phase modulator 10. In this condition, the non-linear Fabry-Perot interferometer C1 is in a state far removed from resonance. While the double injection laser 50 and 60 generates a clock frequency signal, i.e., a train of pulses having a pulse width of 10 to 100 ps, which are supplied to the phase modulator 10, no output pulse signal appears at the output of the device, i.e., the outlet mirrors 23 and 33.

The system is now in a triggering mode; and for its transfer to a switching mode, it is required to achieve a certain intensity of emission (radiation) beyond a threshold value $I_n$ inside the non-linear Fabry-Perot interferometer C1, brightening the interferometer C1 and tuning the non-linear Fabry-Perot interferometer C1 to resonate.

Such brightening or resonance condition is achieved when the clock frequency signal and the external input optical pulses are supplied to the phase modulator 10, simultaneously, that is when their combined intensity is found to be higher than the threshold intensity $I_n$ as shown in FIG. 2.

The dependence of the material used in the non-linear phase modulator 10 on the refraction index n may be represented by the formula, $$n = n_0 + n_2 I_{oper}$$

wherein:

$n_0$ is the material refractive index when the emission (radiation) is absent;

$n_2$ is the medium nonlinear index; and $I_{oper}$ is the intensity of emission inside the non-linear Fabry-Perot interferometer C1.

Owing to the effect of the optical bistability (see T. Abraham et al., "Non-Linear Fabry-Perot Interferometer", *Journal Phys. E: Sci. Instrum, IS*, pp 33–38 (1982)), the optical transmission from the non-linear Fabry-Perot interferometer C1 leaps to the "upper" state as shown in FIG. 2, establishing an optical coupling between the first and the second resonators 20 and 30. In this case, both lasers 20 and 30 enter into a constant radiation mode which sharply increases the intensity of the optical radiation therefrom confined by the outlet mirrors 22 and 32.

As described above, the non-linear effect in the signal generation section C2 causes the brightening of the signal generation section C2 and the sharp increase in the signal output intensity at the outlet mirrors 22 and 32; and this phenomenon is unique to the optical transistor with the characteristics shown in FIG. 2 (see C.A. Lomashevitch et al., "Optical Transistor", *Works of Conf. "Optoelectronics-89"*, Baku, pp 106–107 (1989)).

Figure 3:
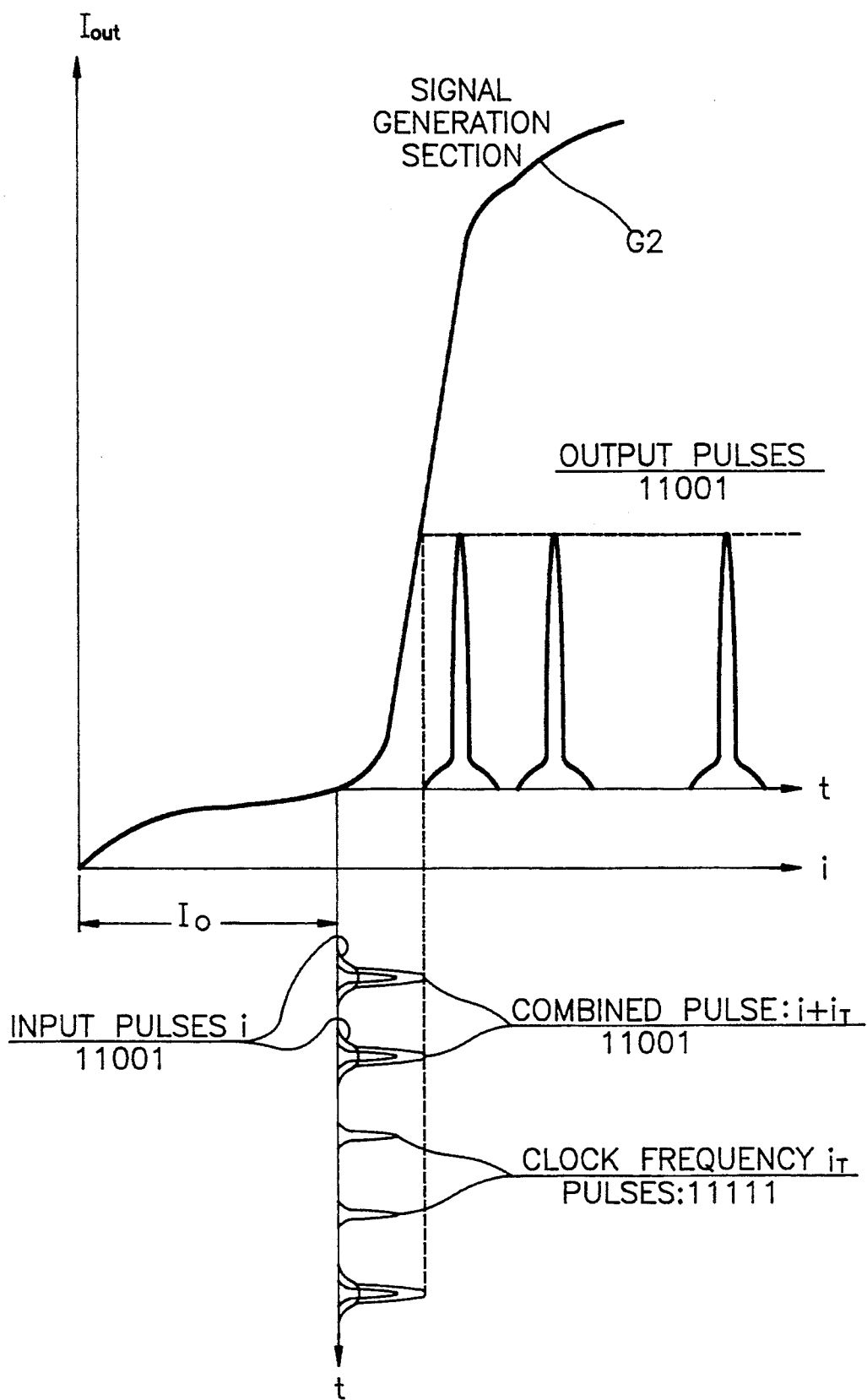
FIG. 3 depicts the device operation upon a simultaneous excitation of the external input pulses (11001) and the clock frequency pulses (11111)

Referring now to FIG. 3, the graph illustrates the effect of the simultaneous excitation of the external input pulses (11001) and the clock frequency pulses (11111).

The external input pulses 1 is transmitted simultaneously, as combined signals, with the clock frequency signal to the phase modulator 10, wherein the pulses having a width which corresponds to the width preset in the double injection laser 50 and 60 are amplified.

Turning now to FIG. 4, the graph explains the procedure of synchronizing the clock frequency with the external input pulses.

Figure 4A:
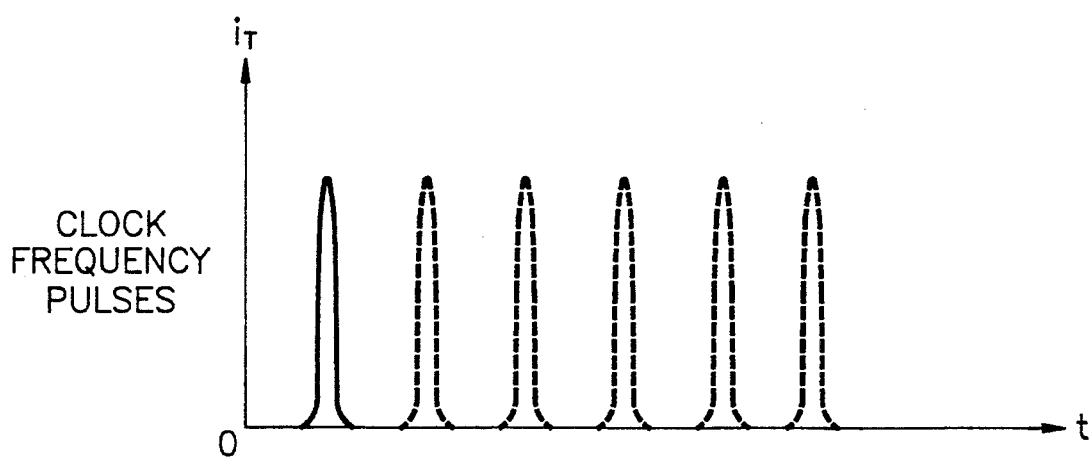
FIGS. 4a, 4b and 4c describe the process of synchronization and reclocking of the clock frequency pulses taking place in response to the incoming optical signal.
Figure 4B:
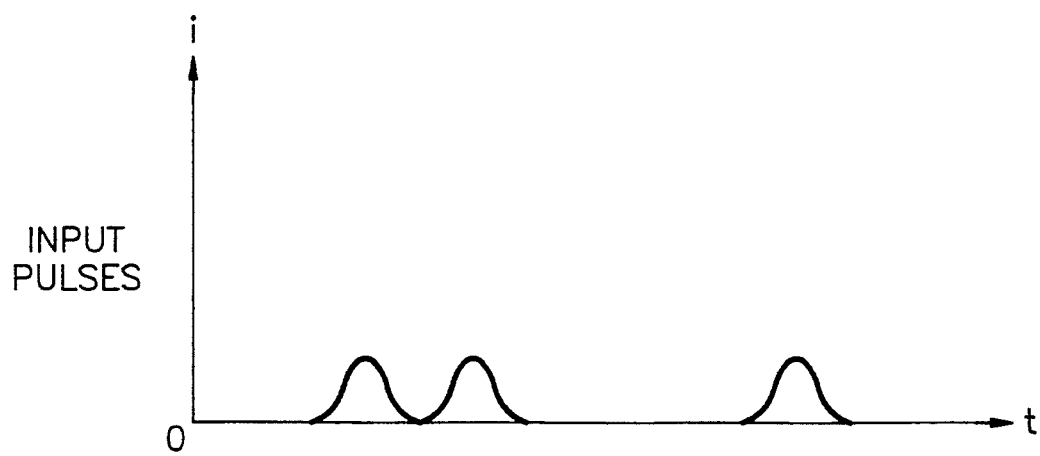
Figure 4C:
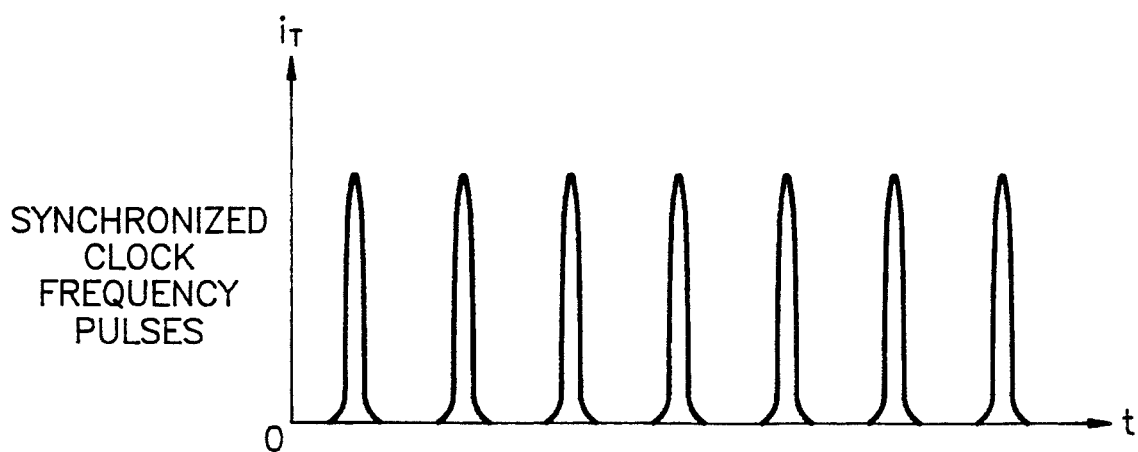

Those clock frequency pulses which would have been produced by the double injection laser 50 and 60 in the absence of an external input signal shown in FIG. 4b (for example, 11001) are shown in dashed lines in FIG. 4a except the first one in the solid line. The first pulse is introduced by an additional effect of the saturable absorber 60 which contributes to its brightening and generation of a clock frequency pulse in the double injection laser at the moment of synchronizing the clock pulse sequence as shown in FIG. 4c.

The external optical pulses (11001) are supplied simultaneously to the double injection laser 10 through the inlet mirror 61 and to the phase modulator 10, as shown in FIG. 1.

The double injection laser 50 and 60 operates in a locking mode with the saturable absorber cell 60 shown in FIG. 1 (see I.S. Goldobin et al., "Control of Spiking Operation of the Two-component Heterolaser Generation", *Quantum Electronics*, 12, No. 5, pp 953–958 (1985)), which renders it possible to acquire a periodical continuous sequence of optical pulses (shown in FIG. 4a) with a pulse width within a range from fractions of ps to hundreds of ps, to be determined by the formula:

$$\Delta \tau = \frac{\Delta \lambda}{c}$$

wherein: $\Delta \lambda$ is the order of the amplification line width for a period $\tau$; and c is the speed of light.

The period $\tau$ is further defined as:

$$\tau = \frac{2L}{c}$$

wherein L is the length of the resonator which corresponds to the frequency of the pulse repetition rate in the GHz range for semiconductor lasers.

To ensure an effective operation of the device, it is necessary to synchronize the clock frequency pulses (11111) produced by the double injection laser with external input pulses (11001).

Therefore, the input pulses 11001 as shown in FIG. 4b are applied to the input of the double injection laser, to thereby cause additional brightening of the saturable absorber 60. And, as a consequence, the optical mode locking is achieved by the flow of pulses applied to the double injection laser 50 and 60, as shown in FIG. 4c.

The non-linear Fabry-Perot interferometer C1 and the output signal generation section C2 operate only in the case when the optical radiation energy applied to the phase modulator 10 exceeds the threshold value $I_n$. It takes place at the fulfillment of the condition that the synchronization exist between the clock and the input pulses. In this case, the output pulse generation mode corresponds to "unity" (1) as shown in FIG. 3.

The pulse width of the output pulses $I_{out}$ corresponding to that of the clock frequency pulses from the double injection laser 50 and 60 are preset within an interval ranging from fractions to hundreds of ps depending on: the level of non-homogeneity of the current injection in the cells 50 and 60 of the double injection laser; the parameters of the semiconductor structure used (concentration of the non-equilibrium carriers, the life time of photons and charge carriers, the mode composition, etc.); and the length ratio of the cells 50 and 60.

Thus, the required width of the regenerated output pulses is obtained by the respective adjustments of the currents applied to the cells 50 and 60 of the doubled injection laser and by the selection of the material used in the semiconductor laser 50 and 60, and the size thereof.

The amplitude of the output pulses may be amplified up to a value to be determined by the slope of the linear section of the optical transistor characteristics curve G2 as shown in FIG. 2 or 3. And, the slope of the characteristic curve G2 as shown in FIG. 2 may be adjusted by controlling such parameters as $\ominus_0$ (the phase angle of detuning of the non-linear Fabry-Perot interferometer C1) and $\ominus_1$ (the phase angle of detuning of the signal generation section C2) and can be preset for the manufacture of the device. It can be further adjusted with the aid of the voltage supplied through the electrode 11 to the phase modulator 10 by using the electrooptical properties of the material employed in the phase modulator 10, or the current in the lasers 20 and 30 (in one or both) owing to the dependence of the refractive index upon the level of the current injection.

Thus, as is shown in FIG. 3, the combined input of the optical signals into the phase modulator 10, i.e., the input signal i and the clock frequency signal $i_T$, permits it to obtain the required additional input to the non-linear Fabry-Perot interferometer C1 in order to make it possible to initiate the above-described process of an avalanche-type phenomenon of: abrupt change of the medium properties in the phase modulator 10; establishment of the resonance condition in the medium; and change of the optical length of the non-linear Fabry-Perot interferometer C1 and, consequently, the signal generation section C2. This, in turn, causes a resonance adjustment of the signal generation section C2, a sharp increase in the radiation intensity inside the first and second resonators 20 and 30 of the signal generation section C2 and a transition of the whole device to an "upper" state, as shown in FIG. 2.

As shown in FIG. 3, the differential amplification of the optical signal generated in the non-linear Fabry-Perot interferometer C1 takes place at the fulfillment of the condition for the detuning parameters, for example, for $\ominus_1=1.71$ and $\ominus_0 \leq 0.6$ (see S. A. Lomashevitch et al., "Optical Transistor Conception", IIC, 55, No. 3, pp 485–489 (1992)).

The intensity value $I_0$ corresponding to the operating point on the characteristic function $I_{out}=f(i)$ is adjusted with currents applied through electrodes 24 and 34 during the operation in the amplification mode.

When the present device is in the mode of the differential amplification, the slope of the characteristic curve is determined by the resonance properties of the non-linear Fabry-Perot interferometer 10 and, to a greater extent, 20 and 30 of the signal generation section C2.

The rapid transfer to the "upper" state of the whole device including the two active elements 20 and 30 anticipates the sharp increase of the intra-resonators light intensity and the amplification factor of above 30 to 40 dB.

The ability of the device to operate on 8 to 10 various wave lengths located from each other at a distance of 1.5 nm is another important advantage of the present invention.

This unique advantage is largely achieved thanks to the optically coupled resonators 20 and 30. This coupling is performed and adjusted by means of the non-linear Fabry-Perot interferometer C1 with the application of voltage through the contact 11, controlling the medium refractive index of the phase modulator 10.

The adjustment, by controlling the transmission coefficient, of the non-linear Fabry-Perot interferometer C1 while maintaining the current in the first and second resonator 20 and 30 unchanged, may also serve to change the frequency of the output radiation $I_{out}$.

Figure 5:
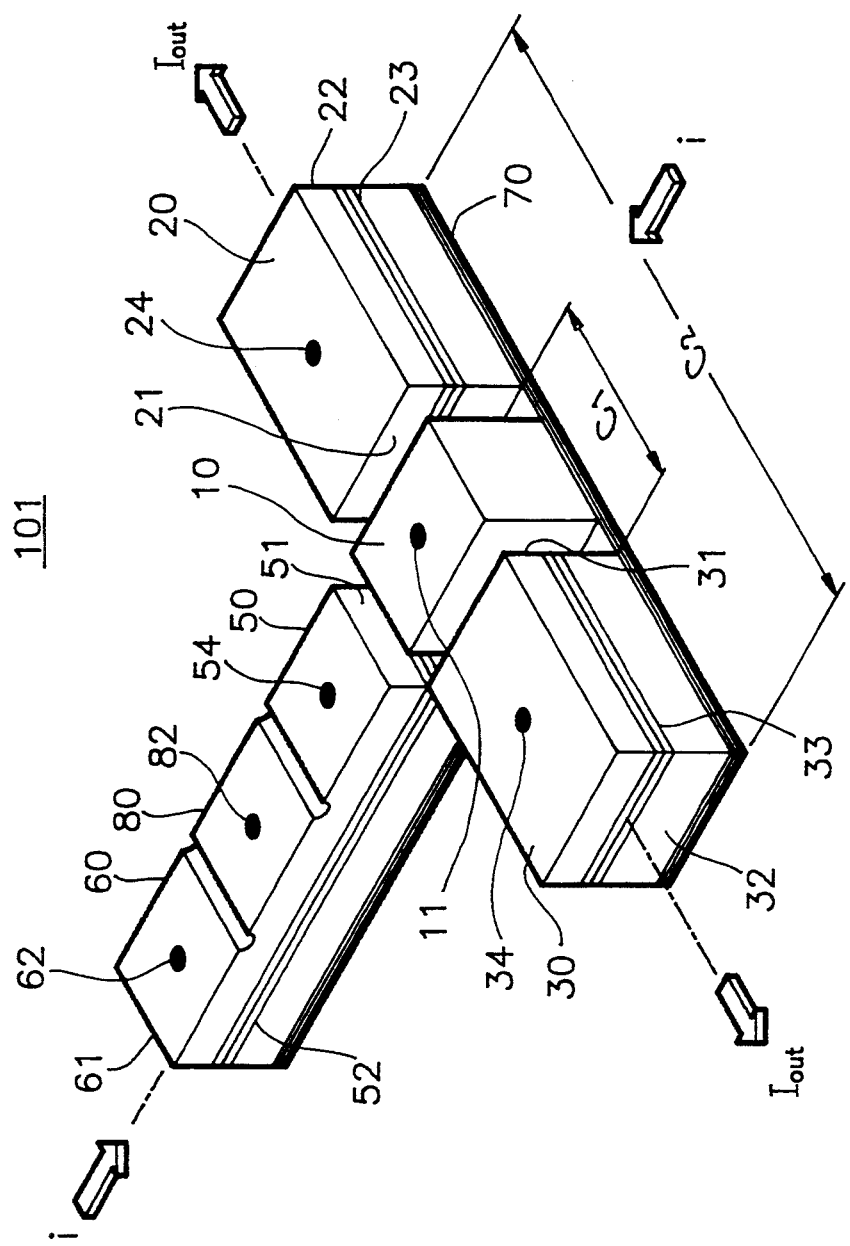
FIG. 5 is a perspective view portraying the optical device provided with a multielectrode injection laser which has two active cells, in accordance with another embodiment of the present invention.

In FIG. 5, there is shown a second preferred embodiment of the optical regenerator 101, provided with a multi-electrode injection laser which has two active cells 50 and 80. The remaining components are identical to that given in FIG. 1.

The optical regenerator 101 can be used with the saturable absorber 60 and several active cells, for example, with two cells 50 and 80 as shown in FIG. 5; and the coupling relationship therebetween permits the adjustments of the laser parameters with the mode locking.

Figure 6:
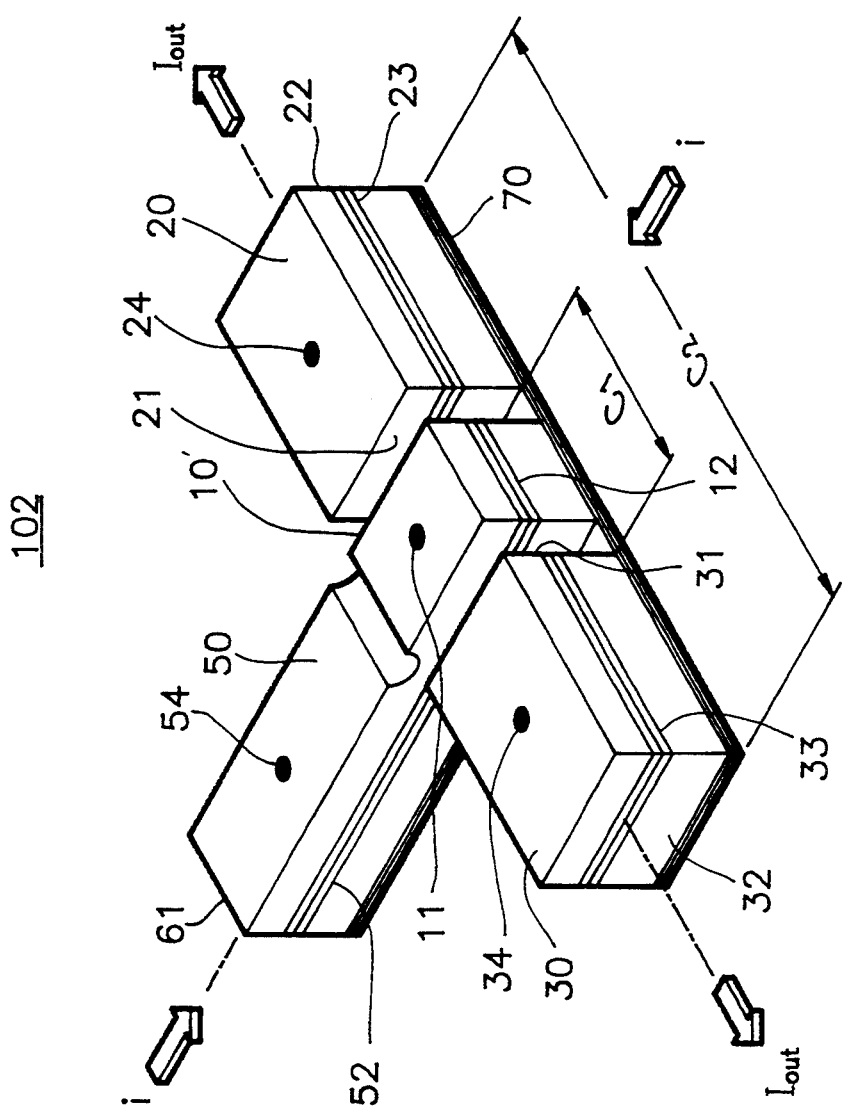
FIG. 6 is a perspective view of the optical device wherein the saturable absorber cell and the phase modulator shown in FIG. 1 are united in a single component, in accordance with a further embodiment of the present invention.

Referring to FIG. 6, there is disclosed a third preferred embodiment of the optical regenerator 102. As shown in FIG. 6, the phase modulator 10 and the saturable absorber 60 shown in FIG. 1 are united in a single component 10', with the remaining components essentially identical to those of FIG. 1.

Figure 7:
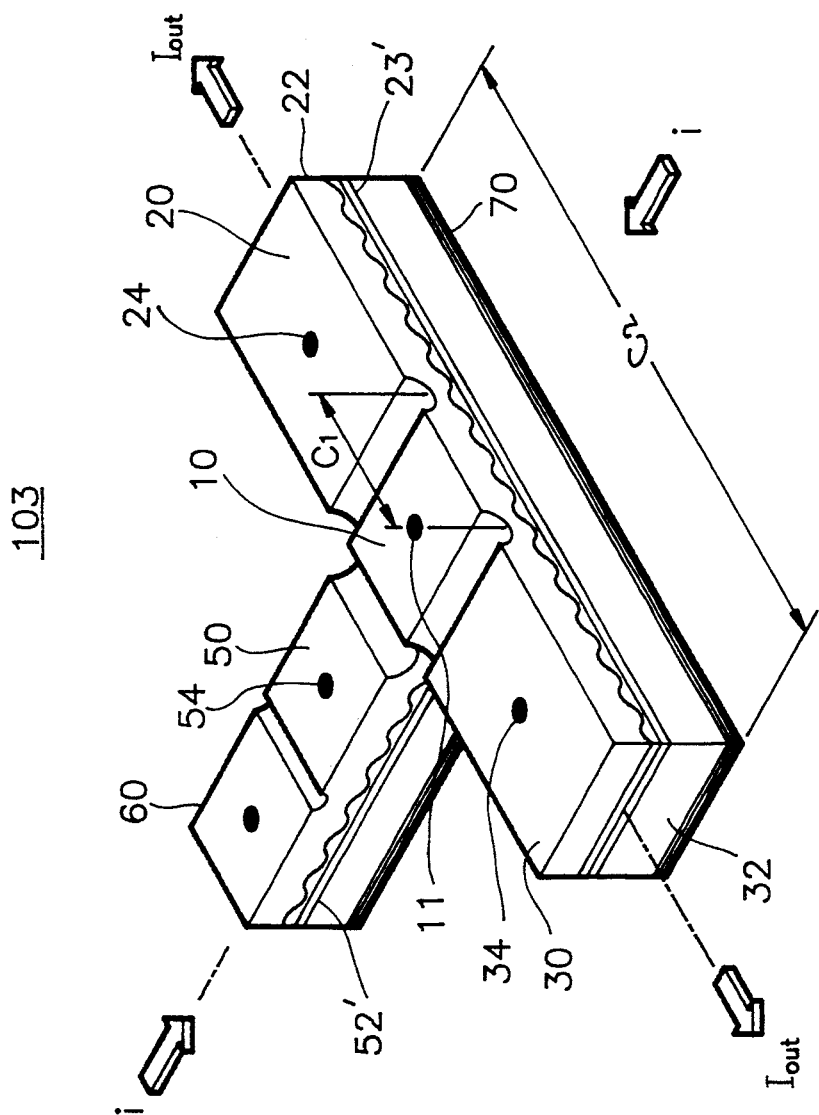
FIG. 7 is a perspective view showing an optical device provided with a distributed feedback structure, in accordance with a still further embodiment of the present invention.

Turning now to FIG. 7, a fourth preferred embodiment of the optical regenerator 103 provided with the distributed feedback structures 23' and 52' is depicted.

The inlet mirrors 21 and 31 are absent, as the feedback is performed by the distributed feedback structures 23' and 52'. The remaining components are substantially identical to those shown in FIG. 1.

As shown in FIG. 7, the integral-optical variant of the device 103 may be made by using the distributed Bragg mirrors of lasers 20 and 30 and the double injection laser or by using the distributed feedback in the signal generation section C2 and the double injection laser.

The active regions of radiations 23' and 52' of the lasers 20, 30 and 50 shown in FIG. 7 can be also made as a multiple quantum wells (MQW)) structure.

The optical device in accordance with the present invention is small-sized and adapted for use in the integrated circuits compatible with other elements of optoelectronics.

While the present invention has been shown and described in connection with the preferred embodiments thereof, it will be readily apparent to those of ordinary skill in the art that many changes and modifications may be made without departing from the spirit and scope of the invention as defined in the appended claims.

What is claimed is:

1. An optical regenerator comprising:
    a first and a second active resonators, each of which has an inlet and an outlet mirrors;
    a rectangular phase modulator optically coupled between the inlet mirrors of the first and the second active resonators, said modulator having a plurality of free interfaces, wherein the phase modulator and the inlet mirrors form a nonlinear Fabry-Perot interferometer; and
    a multielectrode injection laser optically coupled with one of the free interfaces of the rectangular phase modulator.

2. The optical regenerator of claim 1, wherein the inlet mirrors of the first and the second active resonators have a greater transmissivity than their respective corresponding outlet mirrors.

3. The optical regenerator of claim 2, wherein the phase modulator comprises a saturable absorber therein.

4. The optical regenerator of claim 2, wherein the first and the second active resonators, the rectangular phase modulator and the multielectrode injection laser are fabricated on a mono-crystal; and the inlet and the outlet mirrors are made in the shape of a Bragg mirror.

5. The optical regenerator of claim 2, wherein the first and the second resonators, the rectangular phase modulator and the multielectrode injection laser are fabricated on a mono-crystal; and the optical coupling therebetween is achieved by means of a distributed feedback structure.

* * * * *